(12) United States Patent
Miyada

(10) Patent No.: US 7,482,963 B2
(45) Date of Patent: Jan. 27, 2009

(54) D/A CONVERSION CIRCUIT, DISPLAY PANEL DRIVE CIRCUIT, AND DISPLAY

(75) Inventor: Satoshi Miyada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/575,692

(22) PCT Filed: Sep. 26, 2005

(86) PCT No.: PCT/JP2005/017627

§ 371 (c)(1),
(2), (4) Date: Sep. 25, 2007

(87) PCT Pub. No.: WO2006/035711

PCT Pub. Date: Apr. 6, 2006

(65) Prior Publication Data

US 2008/0117089 A1 May 22, 2008

(30) Foreign Application Priority Data

Sep. 29, 2004 (JP) .............................. 2004-284468

(51) Int. Cl.
*H03M 1/78* (2006.01)
(52) U.S. Cl. ...................................... 341/154; 341/144
(58) Field of Classification Search ................. 341/144, 341/145, 154; 345/94, 87, 100
See application file for complete search history.

(56) References Cited

U.S. PATENT DOCUMENTS 6,614,376 B2 * 9/2003 Tanaka et al. ............... 341/144
6,686,858 B2 * 2/2004 Nagao ......................... 341/144
7,403,145 B2 * 7/2008 Choi et al. .................. 341/144

FOREIGN PATENT DOCUMENTS

| JP | 04-358418 A | 12/1992 |
|---|---|---|
| JP | 06-021332 A | 1/1994 |
| JP | 2003-234655 | 8/2003 |
| JP | 2003-308043 | 10/2003 |
| JP | 2003-323161 A | 11/2003 |

OTHER PUBLICATIONS

Translation of International Preliminary Examination Report for corresponding International Application No. PCT/JP2005/17627.

* cited by examiner

*Primary Examiner*—Brian Young
(74) *Attorney, Agent, or Firm*—Mattingly, Stanger, Malur & Brundidge, P.C.

(57) ABSTRACT

A drive circuit for a display panel has a D/A conversion circuit which has a unit region serving as a circuit element that is formed in an IC. Contact pads are provided at both ends in a rectangular guard ring region and at the center thereof. Further, a plurality of MOS switch transistors are arranged and formed respectively between these contact pads. The contact pads arranged at both ends in the unit region, respectively receive one of a plurality of analog voltages. The contact pad at the center is connected to a predetermined output, and the respective switch transistors in the unit region are respectively operated as switch circuits. An analog conversion voltage is obtained by selecting ON/OFF of the plurality of switch transistors in the unit region in response to data.

12 Claims, 7 Drawing Sheets

D/A CONVERSION CIRCUIT, DISPLAY PANEL DRIVE CIRCUIT, AND DISPLAY

FIELD OF THE INVENTION

The present invention relates to a D/A conversion circuit, a display panel drive circuit and a display device, and more specifically, in a D/A conversion circuit (D/A) which is provided so as to correspond to column pins of a display panel and D/A converts display data to produce a drive voltage or a drive current in the column direction or a base current for the drive voltage or the drive current, the present invention relates to an improvement in a D/A, which permits to largely reduce the occupation area, when the D/A is formed in an IC, and easily realizes a driver having many number of drive pins for a display panel.

BACKGROUND ART

For an organic EL display panel in an organic EL display device which is mounted such as on a cellular phone, PHS, DVD player and PDA (Personal Digital Assistant), one having 396 (132×3) terminal pins (column pins) with regard to the number of column lines and 162 terminal pins with regard to the row lines is proposed, and the number of terminal pins with regard to the column and the row tends to increase more than the above number.

As drive circuits for such organic EL display panel, patent applications of the present assignee in which D/As are provided for respective corresponding column pins are known (patent documents 1 and 2). In the patent document 2, the D/As provided for respective corresponding column pins receive display data and a reference current, and D/A convert the display data in corresponding to column pins of the organic EL panel according to the reference current to thereby produce a drive current in the column direction or a base current for the drive current.

Further, with respect to a liquid crystal display panel, the number of the terminal pins for the column lines and the row lines is more than the above number.

Patent Document 1: JP2003-234655A
Patent Document 2: JP2003-308043A

Recent years, the number of the drive pins for an organic EL display device tends to increase due to demand for higher resolution. In a full color QVGA for an organic EL display device now being developed, the number reaches up to 360 pins, 120 pins each for R, G and B which at the present requires three drivers.

Now, for a divided resistor and voltage output type D/A which is built-in in a drive circuit such as for a liquid crystal display panel and an organic EL panel, a switch circuit of E/D MOS in which a depression MOS transistor (D-MOS) and an enhancement MOS transistor (E-MOS) are connected in series is usually used as for a high withstanding voltage application (power source voltage of about 20 V).

In this instance, as shown in FIG. 6, a D/A 10 is constituted by a reference voltage generating circuit 1, a selection circuit 2 and a buffer amplifier (voltage follower) 3.

The reference voltage generating circuit 1 uses a divided resistor circuit in which sixteen resistors R1~R16 are connected in series, and in the D/A 10, the selection circuit 2 receives divided voltages generated between respective resistors in the divided resistor circuit for the reference voltage generating circuit 1. Then, to the selection circuit 2 display data of four bits D0~D3 are applied, a transistor group constituted by many switch circuits of E/D-MOSs in the selection circuit 2 is selectively ON/OFF driven, one of the divided voltages is selected and sends out to the buffer amplifier 3, and a D/A converted output voltage V0 is generated at an output terminal 3a of the buffer amplifier 3.

Further, in the drawing, white circles (○) show E-MOS switch transistors TrE and black circles (●) show D-MOS switch transistors TrD.

Vin is a reference input voltage applied externally to the reference voltage generating circuit 1.

"H" (=High level) or "L" (=Low level) signals of the display data of four bits D0~D3 inputted to the selection circuit 2 are selectively supplied to gates of these transistors via control signal lines 8a~8h.

Further, beneath the gate regions of these transistors to which the control signal lines 8a~8h are to be connected selectively, a source region and a drain region of the respective transistors are formed with a predetermined interval (see FIG. 7, which will be explained later). 9a~9d are inverters which are connected respectively to the control signal lines 8a, 8c, 8e and 8g, invert the display data D0~D3 of four bits and apply the same to the respective gates to which the control signal lines 8a, 8c, 8e and 8g are connected.

The divided resistor type D/A 10 selects one row component of switch transistors TrE and switch transistors TrD arranged in lateral direction with respect to one voltage divided point of a resistor connected to the control signal lines 8a~8h according to "H" or "L" of display data of four bits D0~D3, turns ON these transistors at the same time and selects one of voltages at divided voltage points of respective resistors in response to the display data of four bits D0~D3. The selected voltage at the divided voltage point is applied to (+) input of the buffer amplifier 3. Thereby, D/A conversion is performed and an analog voltage V0 is generated at the output terminal 3a.

In the selection circuit 2, a range C indicated by a dotted line and surrounded by a laterally long rectangular frame usually constitutes one unit region (cell) which is formed as one circuit element in an IC and a switch transistor group of four E-MOSs and four D-MOSs, eight in total is provided in one unit region (cell) C. In addition, a guard ring is provided for every unit region C to separate the regions, and by arranging these unit regions C in longitudinally or laterally the selection circuit 2 in the D/A is constituted. At both ends of the respective unit regions contact pads 6 for wiring are respectively provided.

FIG. 7 is a diagram for explaining a layout of one unit region (cell) formed by transistors constituting the selection circuit 2 in the D/A.

In FIG. 7, numeral 4 is a source-drain forming region in which sources, drains or both of the respective transistors are formed with a predetermined interval corresponding to respective gate intervals between contact pads at both ends.

Namely, in the enhancement MOS TrE (herein below will be called as E-MOS TrE) and depression MOS TrD (herein below will be called as D-MOS TrD), the source-gate-drain are arranged in this order and a source of an E-MOS TrE and a drain of a subsequent D-MOS TrD are formed as a common region. Alternatively, a drain of an E-MOS TrE and a source of a subsequent D-MOS TrD are formed as a common region.

5e is a gate region of a switch transistor TrE, 5d is a gate region of a switch transistor TrD, and the gate regions 5e and 5d are formed in a narrow rectangular shape over the predetermined interval forming the source-drain region. Since the respective transistors are switch MOSs, the gate length of the respective gate regions is short and in contrast the gate width thereof is formed long.

The source•drain forming region 4 is formed as collectives of source•drain regions provided with the predetermined interval between the contact pads 6 provided at both ends. Numeral 7 is a guard ring in a vertically longer rectangular shape provided in the IC, and inside thereof the contact pads 6 and the respective transistors are formed to constitutes one unit region (cell) C.

Further, square points respectively provided on the contact pads 6, guard ring 7 and the gate regions 5e and 5d are contacts.

SUMMARY OF THE INVENTION

Tasks to be Solved by the Invention

Since a D/A is provided so as to correspond respective terminal pins of such as a liquid crystal display panel and an organic EL panel, an increase in number of the terminal pins of such as the liquid crystal display panel and the organic EL panel entails an increase of driver ICs and causes an increase in manufacturing steps and in manufacturing cost of such as the liquid crystal display panel and the organic EL panel. Moreover, since the bit number of a D/A for an organic EL display device increases recently from four bits type to six though eight bits type, the occupation area of the D/A in a driver IC tends to increase. Further, due to demand of lowering power consumption, the power source voltage reduces to around 15 V.

Accordingly, in order to reduce the occupation area of the D/A, it is conceived to constitute the switch circuit with a single E-MOS in view of the withstanding voltage. However, as shown in FIG. 7, the contact pads 6 usually occupy an area of about four transistors in a D/A of one unit region. For this reason, the occupation ratio of the contact pads 6 and the guard ring 7 is comparatively large with respect to in number of the transistors in one IC. Accordingly, a decrease in number of the MOS transistors does not contribute to a large decrease in the occupation area in connection with the occupation area of a D/A in one IC.

An object of the present invention is to resolve these problems in the conventional art and to provide a D/A, which permits to reduce the occupation area largely when the same is formed in an IC.

Another object of the present invention is to provide a display panel drive circuit and a display device which easily realizes a driver with a many number of drive pins with respect to a display panel.

Measures for Resolving the Tasks

A constitution of a D/A, a display panel drive circuit or a display device of the present invention for achieving these objects includes a D/A conversion circuit which is provided with a reference voltage generating circuit which generates respectively a plurality of analog voltages for D/A conversion at a plurality of terminals, which connects the respective analog voltages of the reference voltage generating circuit respectively to a predetermined output via a plurality of switch circuits and which obtains one of the plurality of analog voltages at the predetermined output as an analog conversion voltage by selectively turning ON/OFF of the plurality of switch circuits in response to data, wherein in the D/A conversion circuit a unit region serving as a circuit element is formed in an IC by providing respectively contact pads at both ends in a rectangular guard ring region and at the center thereof and by arranging and forming a plurality of MOS switch transistors respectively between these contact pads, the contact pads at both ends in the unit region respectively receive one of the plurality of analog voltages, the contact pad at the center is connected to the predetermined output, the respective switch transistors in the unit region are respectively operated as the switch circuits, thereby, by selecting ON/OFF of the plurality of switch transistors in the unit region in response to the data the analog conversion voltage is obtained.

ADVANTAGES OF THE INVENTION

According to the present invention as has been explained above, with one unit region two analog voltages (when the reference voltage generating circuit is a divided resistor type, voltages at divided voltage points) can be received from the reference voltage generating circuit, moreover, since analog voltages (voltages at divided voltage points) of two portions can be outputted through a single contact pad, a conventional portion corresponding to two unit regions is constituted into one unit region. Further, since such one unit region only requires three contact pads, such one unit region corresponding to the two components occupies a smaller region than that of the conventional two unit regions, because the corresponding size in total is determined by addition of one contact pad and by subtraction of a portion corresponding to one unit region in comparison with the two unit regions, moreover, the total number of the unit regions can be reduced to about half of the conventional number.

The area occupied by the added one contact pad corresponds to that occupied by about four switch transistors in a D/A, and in a D/A conversion circuit, since a plurality of unit regions are used depending on number of conversion bits, in the present invention the occupation area can be greatly decreased depending on an increase in number of conversion bits.

As a result, according to the present invention, the occupation area of a D/A when formed into an IC can be reduced, in particular, the occupation area decreasing effect of a D/A for a driver having many number of drive pins with respect to a display panel is significant.

BEST MODES FOR CARRYING OUT THE INVENTION

FIG. 1 is a circuit diagram of a four bits type D/A of an embodiment to which a D/A according to the present invention is applied, FIG. 2 is a view for explaining a layout of one unit region (cell), FIG. 3 is a view for explaining aluminum wiring for the unit region (cell) in FIG. 2, FIG. 4 is a circuit diagram of a D/A of an embodiment which drives an active matrix type liquid crystal display panel and FIG. 5 is a circuit diagram of a D/A of an embodiment which drives an active matrix type organic EL panel. In the respective drawings, the same constitutional elements as shown in FIGS. 6 and 7 are designated by the same reference numerals and the explanation thereof is omitted.

In FIG. 1, numeral 20 is a D/A and is constituted by a reference voltage generating circuit 1, a selection circuit 11 and a buffer amplifier 3.

The selection circuit 11 is constituted by unit regions CE each of which is formed by a group of up and down two stage switch circuits of E-MOSs and receives display data of four bits D0~D3 to selectively turn ON/OFF E-MOSs TrE of switch operation. In one unit region (cell) formed as one circuit element in an IC, three contact pads are provided (see FIG. 2).

Control signal lines 8a~8h are selectively connected to each of gate regions of respective E-MOSs at crossing points (●) as shown in the drawing so that E-MOSs TrE of switch operation arranged in lateral direction in one row with respect to one of the divided resistor voltage points are selectively turned ON according to "H" and "L" of display data of four bits D0~D3. Thereby, one voltage among those at respective divided resistor voltage points is selected and applied to (+) input of the buffer amplifier 3 to obtain an analog converted voltage V0 at an output terminal 3a.

FIG. 2 is a layout diagram of the one unit region (cell).

As shown in FIG. 2, three contact pads 6 are provided respectively at top and bottom ends and the center thereof. Then, between these contact pads, namely, between one of contact pads 6 at both ends and the center contact pad 6 and between the other of contact pads 6 at both ends and the center contact pad 6, four narrow rectangular shaped gate regions 12 are respectively provided as gate regions for the respective E-MOSs TrE of switch operation. The gate length thereof is short, but in contrast thereto, the width thereof is long. Source-drain forming regions provided respectively as 4a and 4b between contact pads 6 disposed at both ends and at the center thereof, source-gate-drains of one E-MOS TrE and subsequent E-MOS TrE are successively arranged and the source of the one E-MOS TrE and the drain of the subsequent E-MOS TrE are formed as a common region. Then, the gate regions for the respective E-MOSs TrE bridging between these sources and drains are respectively formed with a predetermined interval. Thereby, at the source-drain forming region 4a and the source-drain forming region 4b, the source and drain regions as well as the gate regions of four E-MOSs TrE of switch operation are respectively formed. At the respective gate regions 12 and contact pads 6, contacts 13 are respectively provided. Each of the contacts 13 is connected to one aluminum wire on an upper aluminum wiring layer.

FIG. 3 is a connection diagram of the aluminum wires

Each two of the aluminum wires 14 on the upper layer are allotted to one of the respective narrow rectangular shaped gate regions 14 so as to be arranged in the longitudinal direction (vertical direction) thereof.

The size of the gate region 12 is, for example, length L=1.5 μm, width W=3.2 μm and the gate interval D=0.5 μm.

As shown in the drawing, the two aluminum wires 14 on the respective gate regions 12 are respectively for receiving signals at the same digit position among four bit display data (D0~D3), and as shown in FIG. 1, when one of the two aluminum wires 14 receives a signal (D0~D3) at a certain digit position of the display data, the remaining one receives via an inverter the signal (D0~D3) at the same certain digit position. For this reason, in the present embodiment, the two aluminum wires 14 are provided for the respective gate regions.

Further, as shown in the drawing, since each of the contacts 13 is disposed between the two aluminum wires 14 at the respective gate regions 14, when the area at the position of respective contacts 13 of either upper and lower wiring lines of the aluminum wires 14 is spread and extended over the corresponding contact 13, the contact 13 is easily and selectively connected to either one of the aluminum wires 14. Of course, the aluminum wires 14 are not required to be connected to some of gate regions 12.

Further, for the connection with the aluminum wires 14, when each contact 13 is formed in a size so that a part thereof overlaps partly with respective two aluminum wires 14 and no insulation layer is provided under the overlapping portion of the aluminum wire 14 at the side to be wired, the contact 13 can be connected to either one of the aluminum wires 14 at the overlapping portion. In the drawing, since the aluminum wires 14 are for connecting to the gate regions of E-MOSs TrE in adjacent unit region CE, these aluminum wires 14 are not connected to the contacts 13. For this reason, the contact portions are not illustrated.

In this manner, for each of the gate regions 12 two aluminum wires 14 are provided and one of which is selectively connected to each of the gate regions. Then, by reducing one contact pad 16 and forming the two unit regions (cell) C as shown in FIG. 6 into one unit region (cell) CE, the occupation area for the unit region (cell) C can be reduced, although the area for four switch transistors increases.

When assuming the size of one contact pad 6 is equivalent to four transistors and the size of the unit region CE is compared with that of the conventional one base on the number of transistors, and further the size of one unit region (cell) C as shown in FIG. 6 is assumed equivalent to sixteen transistors, the size of one unit region (cell) CE, which was equivalent to 16×2=32 transistors when formed in the conventional manner, is equivalent to twenty transistors, thereby, the occupation area thereof in an IC is reduced by about 38%. Further, since the one unit region (cell) CE performs the functions comparable to two conventional ones, further, when considering the area such as for forming two guard rings, the adjacent unit regions are arranged in further high density, thereby, the occupation area thereof is further reduced.

Since one D/A requires unit regions (cell) CE in the number of cumulative times of conversion bit number for "2" depending on the digit number of the conversion data, the occupation area is greatly reduced. Moreover, such is of course true with respect to a display panel drive circuit such as for a liquid crystal display panel, in particular, in an organic EL drive circuit, since the required number of the unit regions amounts to a multiple of the terminal pin number of the organic EL panel, the occupation area reducing effect is further significant.

FIG. 4 is a view for explaining a D/A in an instance of six bit display data corresponding to that in FIG. 1, which is for a voltage drive circuit for driving an active matrix type liquid crystal display panel.

Numeral 21 is a D/A and is constituted by a reference voltage generating circuit 1, a selection circuit 15 and a buffer amplifier 3. The reference voltage generating circuit 1 is a divided resistor voltage circuit formed by connecting 64 resistors R1~R64 in series. The display data inputted to the selection circuit 15 is in six bits of D0~D5.

Further, in the layout diagram corresponding to that in FIG. 2, since the number of E-MOSs TrE between the top and bottom contact pads increases respectively only by two in relation to the change from four bits to six bits, an explanation thereon is omitted.

In the drawing, numeral 16 is a driver IC for driving a liquid crystal display panel, 17 is an output terminal thereof, 18 is a pixel circuit in an active matrix type liquid crystal display panel and 18a is a terminal pin of the liquid crystal display panel 18 which receives an output voltage of the D/A 21.

In the pixel circuit 18, an N channel transistor TM is turned ON/OFF by signals (input at the side of Y line) from a gate driver (not shown), and when the transistor is turned ON, a voltage generated at the output terminal pin 17 of the driver IC 16 serving as a source driver is applied via the terminal pin 18a (input at the side of X line) to a liquid crystal cell CL serving as a load.

FIG. 5 is a view for explaining a D/A in an instance of six bit display data corresponding to that in FIG. 1, which is for a voltage drive circuit for driving an active matrix type organic EL display panel.

The active matrix type liquid crystal display panel 18 in FIG. 4 is displaced by an active matrix type organic EL panel 180.

Herein, in the drawing, numeral 16 is a driver IC for driving an organic EL panel, 17 is an output terminal thereof, 180 is a pixel circuit in an active matrix type organic EL panel and 18*a* is a terminal pin of the active matrix type organic EL panel 180 which receives an output voltage of the D/A 21. In addition, numeral 19 is an organic EL element provided in the pixel circuit.

Although there is a difference whether the object is a liquid crystal panel or an organic EL panel, the drive operation thereof as a voltage drive operation does not substantially differ, the explanation thereof is omitted.

INDUSTRIAL APPLICABILITY

As has been explained hitherto, although the reference voltage generating circuit 1 in the embodiments is one for divided resistor voltage type, in the present invention, the reference voltage generating circuit 1 can be any circuit structure if the circuit generates analog voltages for D/A conversion respectively at many terminals.

Further, the D/A in the embodiments outputs a voltage, however, for example, when providing such as a voltage-current conversion circuit at the output side and converts a converted output voltage into a current, a D/A of current output can be used. With such modified D/A, an organic EL panel can also be driven.

Further, the application of the D/A according to the present invention is not limited to such as an organic EL drive circuit and an organic EL display device.

EXPLANATION OF REFERENCE NUMERALS

Figure 1:
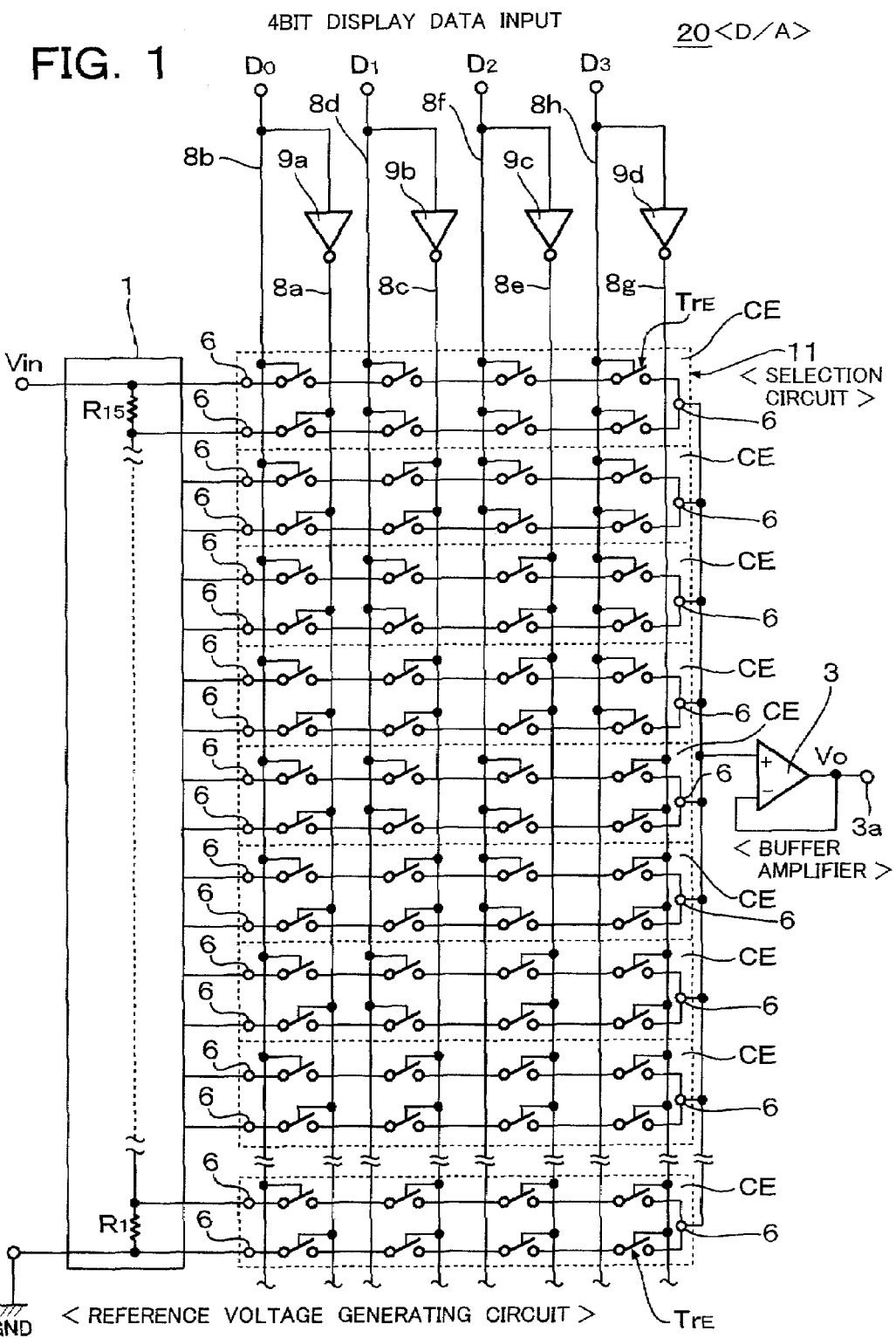
FIG. 1 is a circuit diagram of a four bits type D/A of an embodiment to which a D/A according to the present invention is applied.
Figure 2:
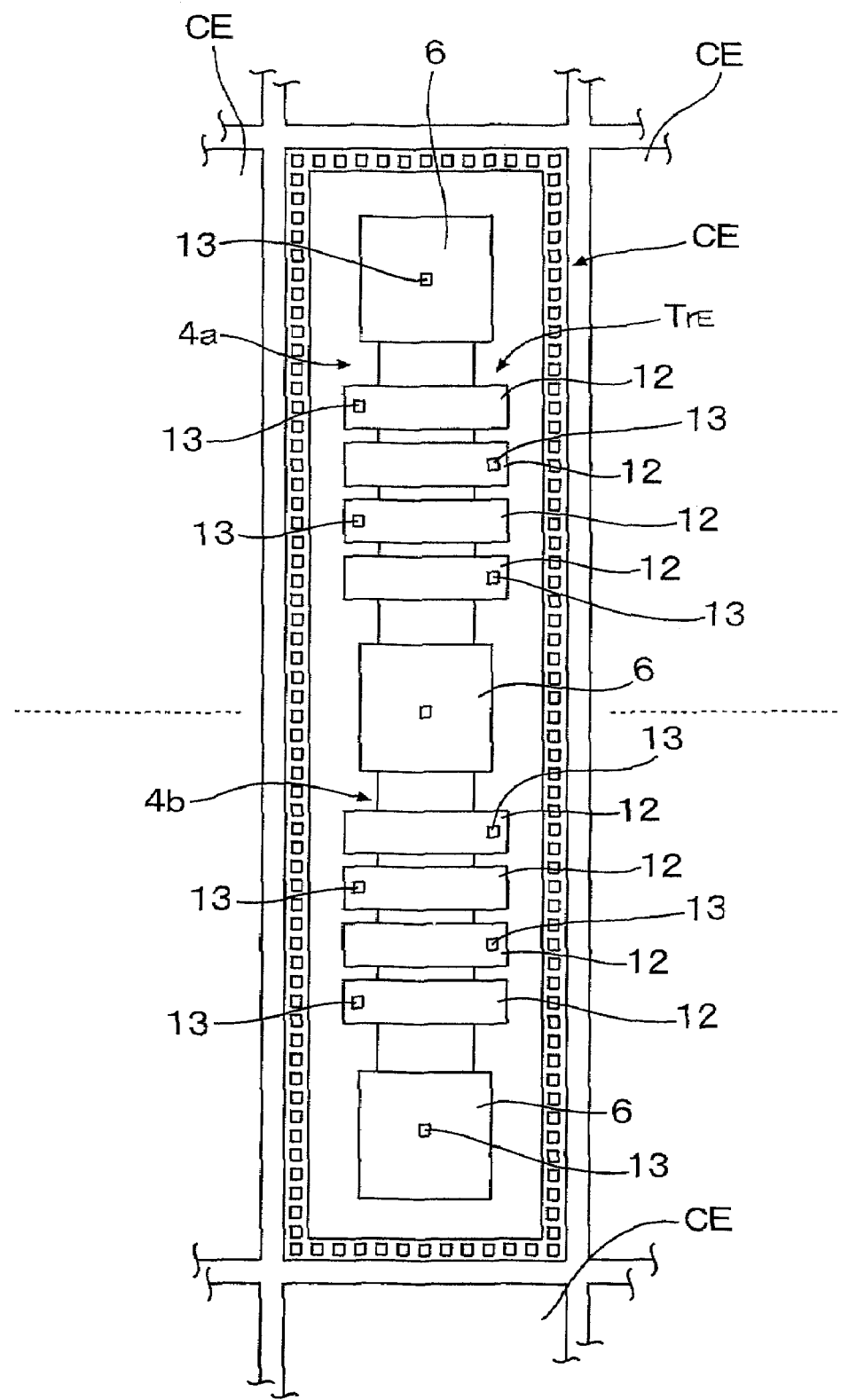
FIG. 2 is a view for explaining a layout of one unit region (cell).
Figure 3:
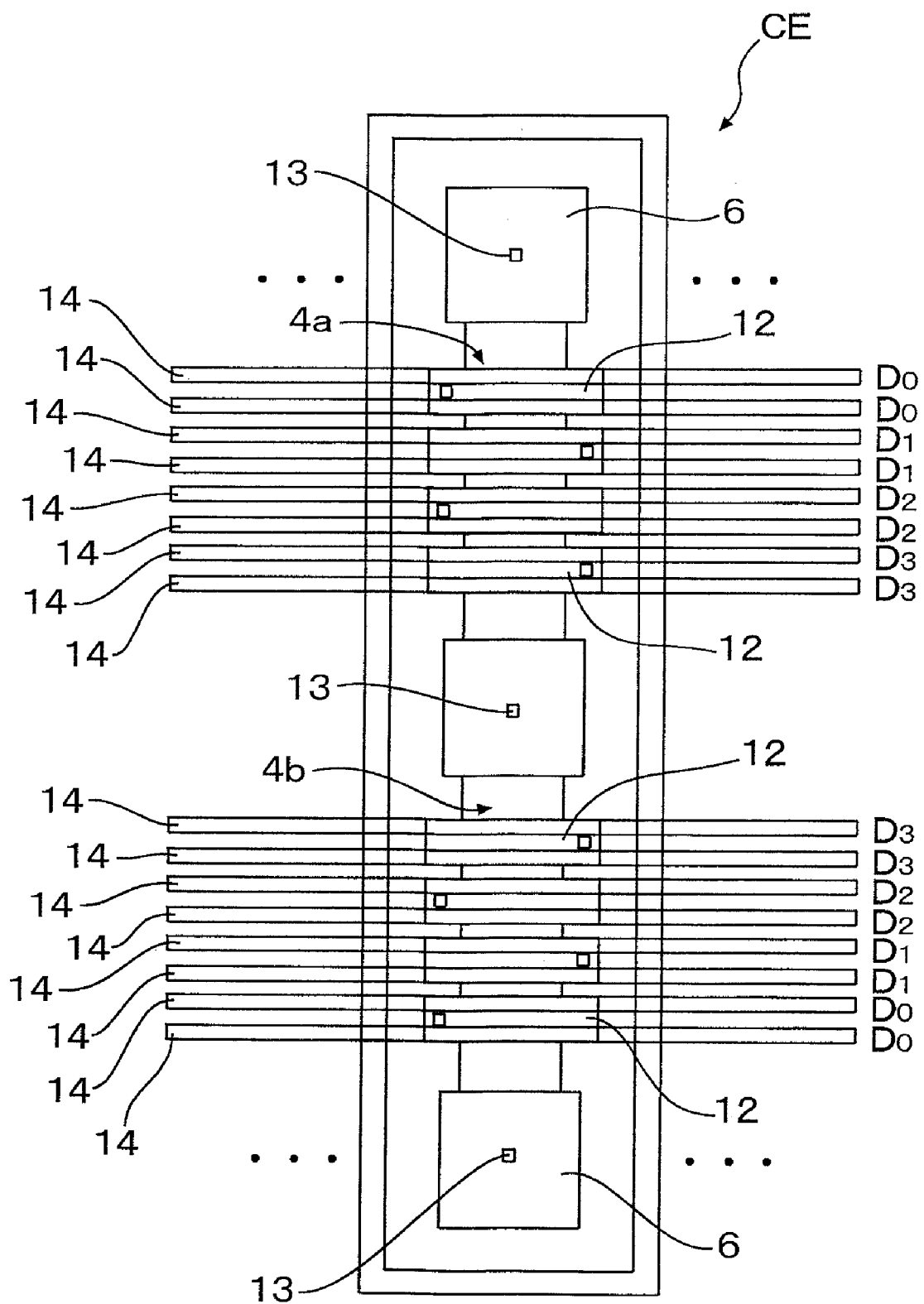
FIG. 3 is a view for explaining aluminum wiring for the unit region (cell) in FIG. 2.
Figure 4:
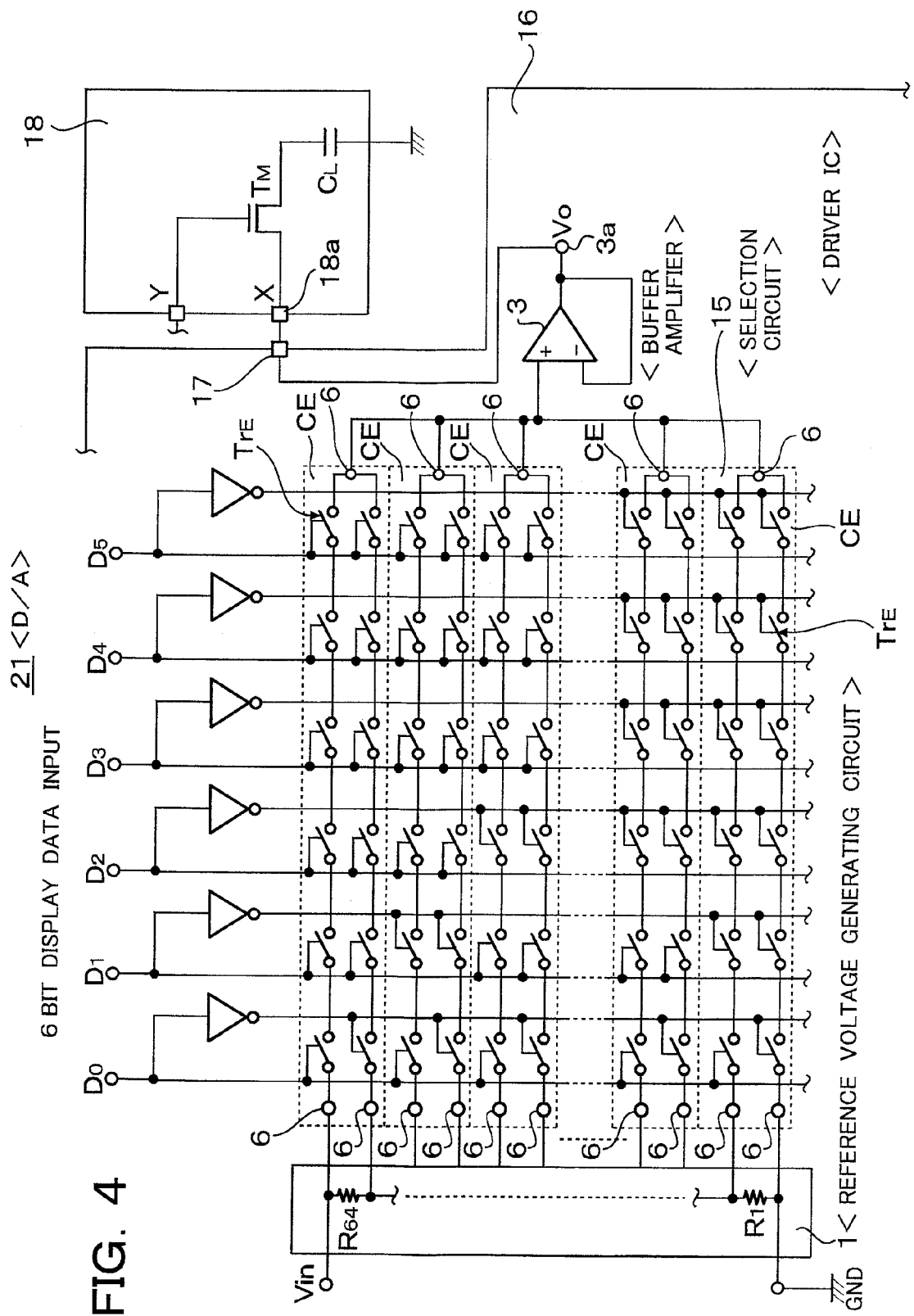
FIG. 4 is a circuit diagram of a D/A of an embodiment, which drives an active matrix type liquid crystal display panel.
Figure 5:
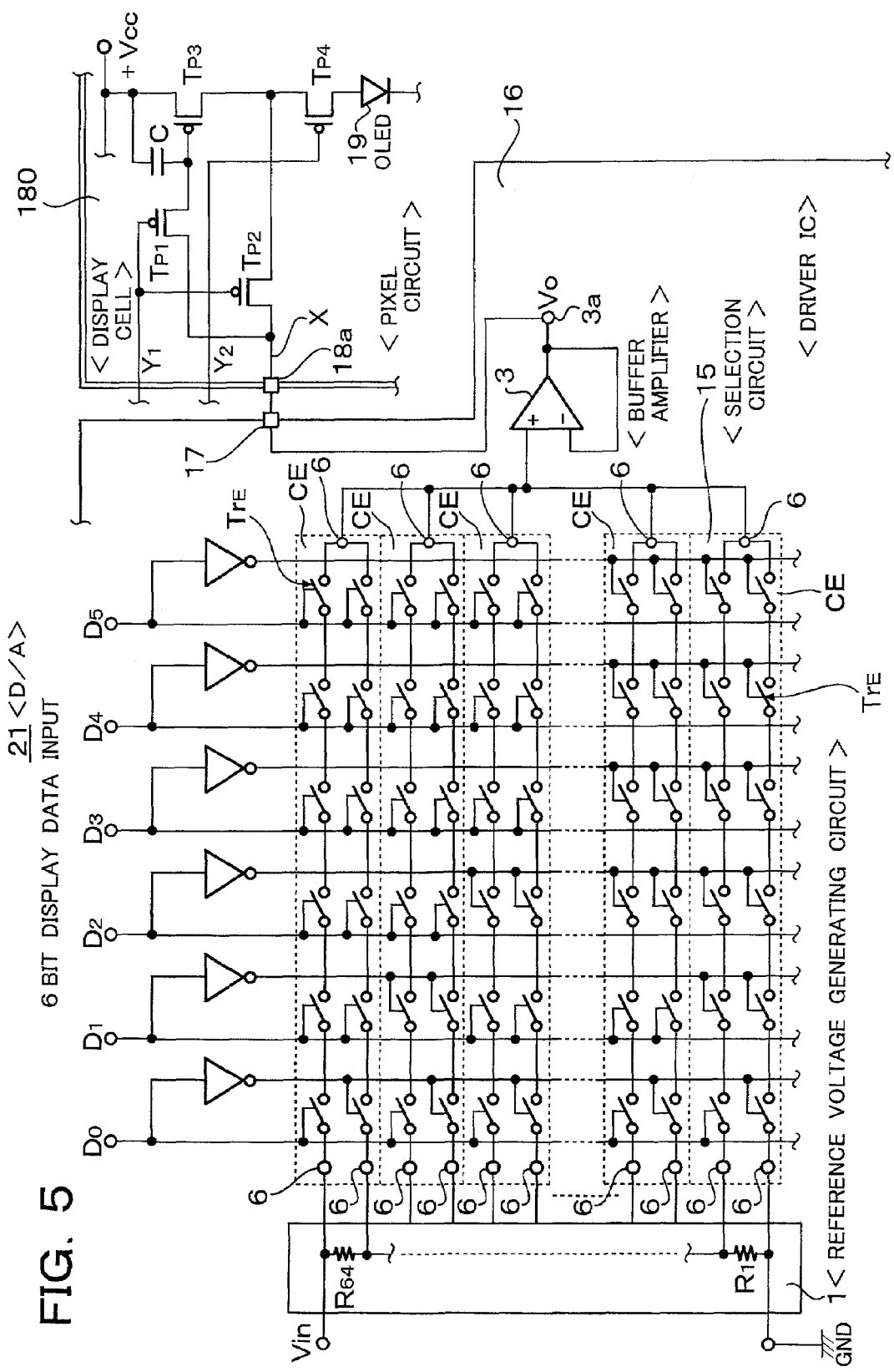
FIG. 5 is a circuit diagram of a D/A of an embodiment, which drives an active matrix type organic EL panel.
Figure 6:
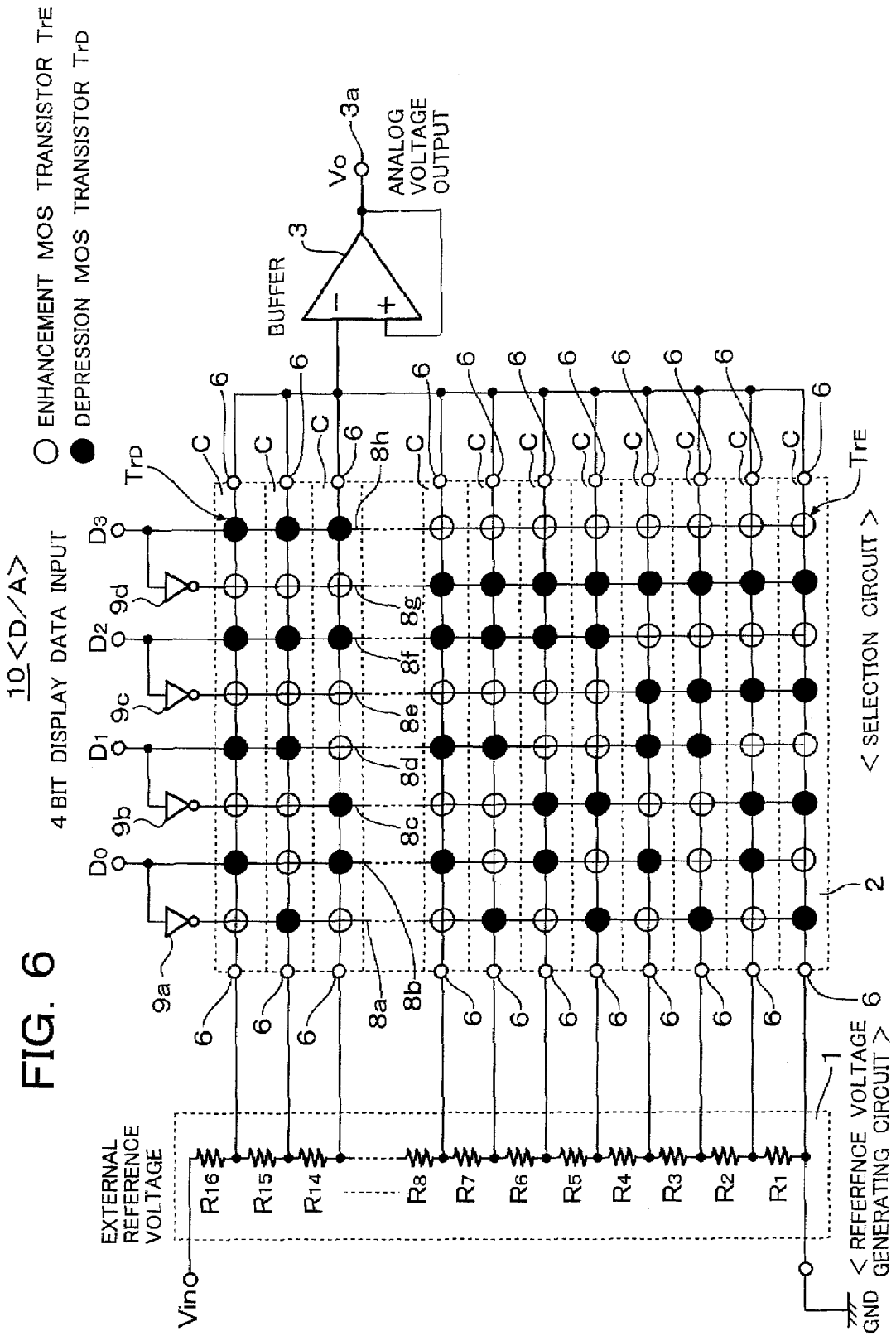
FIG. 6 is a view for explaining a transistor arrangement in a D/A for a conventional organic EL drive circuit.
Figure 7:
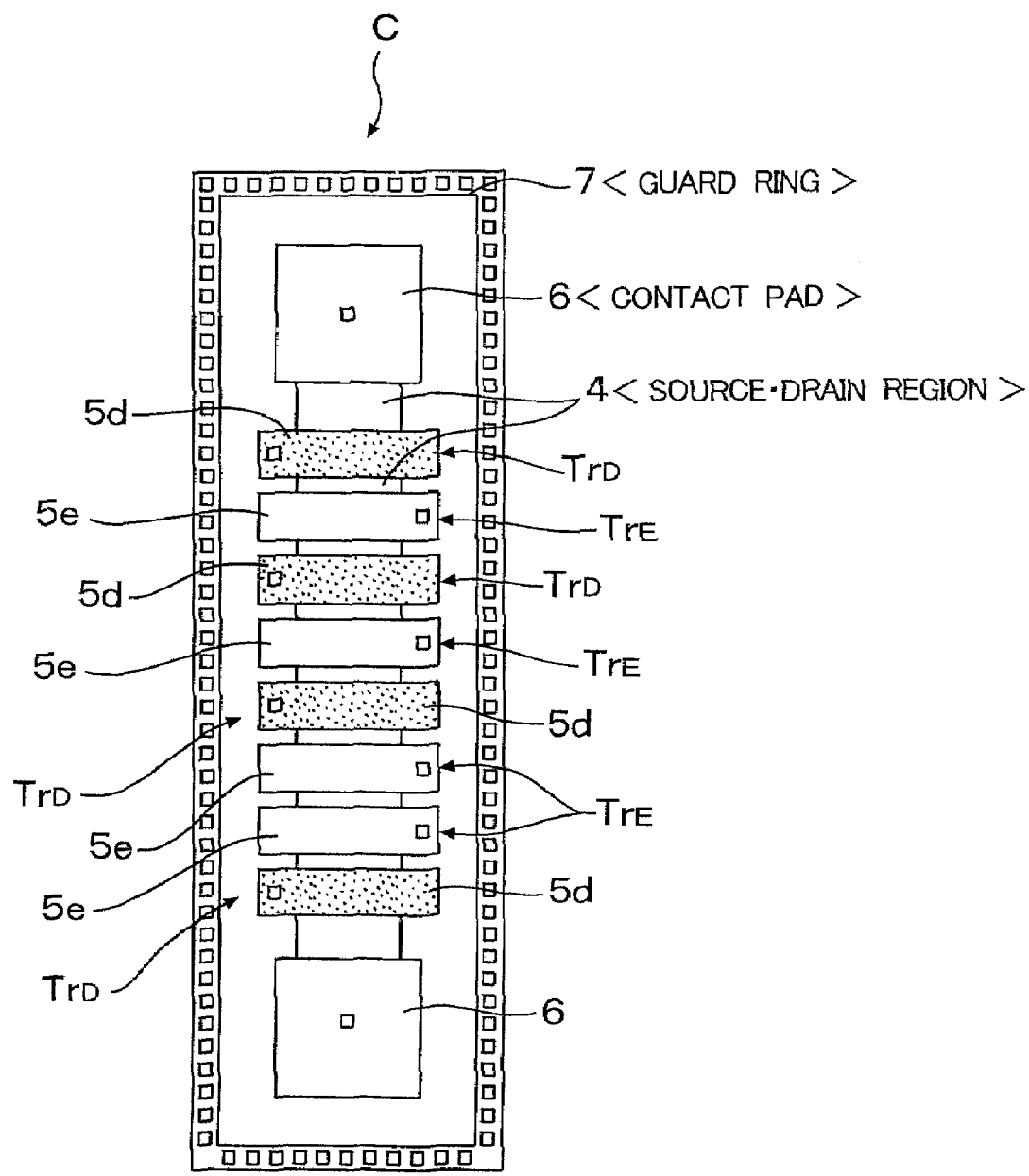
FIG. 7 is a diagram for explaining a layout of one unit region (cell) formed by transistors constituting the D/A in FIG. 6.

1 . . . Reference voltage generating circuit (divided resistor voltage circuit),
2, 11, 15 . . . Selection circuit,
3 . . . Buffer amplifier (voltage follower)
4 . . . Source drain forming region,
5*e* . . . Gate region of enhancement MOS transistor (E-MOS),
5*d* . . . Gate region of depression MOS transistor,
6 . . . Contact pad,
7 . . . Guard ring,
8*a*, 8*h* . . . Control signal line,
9 . . . Inverter,
10, 20, 21 . . . D/A conversion circuit (D/A),
12 . . . Gate region,
13 . . . Contact,
14 . . . Aluminum wire,
16 . . . Driver IC,
17 . . . Output terminal pin,
18, 180 . . . Pixel circuit,
19 . . . Organic EL element,
C, CE . . . Unit region (cell).

The invention claimed is:

1. A D/A conversion circuit which comprises a reference voltage generating circuit which generates respectively a plurality of analog voltages for D/A conversion at a plurality of terminals, which connects the respective analog voltages of the reference voltage generating circuit respectively to a predetermined output via a plurality of switch circuits and which obtains one of the plurality of analog voltages at the predetermined output as an analog conversion voltage by selectively turning ON/OFF of the plurality of switch circuits in response to data, wherein in the D/A conversion circuit a unit region serving as a circuit element is formed in an IC by providing respectively contact pads at both ends in a rectangular guard ring region and at the center thereof and by arranging and forming a plurality of MOS switch transistors respectively between these contact pads, the contact pads at both ends in the unit region respectively receive one of the plurality of analog voltages, the contact pad at the center is connected to the predetermined output, the respective switch transistors in the unit region are respectively operated as the switch circuits, thereby, by selecting ON/OFF of the plurality of switch transistors in the unit region in response to the data the analog conversion voltage is obtained.

2. A D/A conversion circuit according to claim 1, wherein the reference voltage generating circuit is provided in the IC, includes a divided resistor voltage circuit formed by connecting a plurality of resistors in series and produces the analog voltages depending on voltages at a plurality of divided voltage points, and a plurality of the unit regions are arranged in adjacent manner in the IC.

3. A D/A conversion circuit according to claim 2, further comprising a buffer amplifier connected to the predetermined output, wherein an output of the buffer amplifier serves as the output of the D/A conversion circuit and the buffer amplifier is provided in the IC.

4. A D/A conversion circuit according to claim 3, wherein the unit region is formed as a cell including the guard ring, and the MOS transistor is an enhancement MOS transistor.

5. A D/A conversion circuit which connects respectively voltages at a plurality of divided voltage points of a divided resistor voltage circuit formed by connecting a plurality of resistors in series to a predetermined output via a plurality of switch circuits and which obtains one of the voltages of the plurality of divided voltage points at the predetermined output as an analog conversion voltage by selectively turning ON/OFF of the plurality of switch circuits in response to data, wherein in the D/A conversion circuit a unit region serving as a circuit element is formed in an IC by providing respectively contact pads at both ends in a rectangular guard ring region and at the center thereof and by arranging and forming a plurality of MOS switch transistors respectively between these contact pads, the contact pads at both ends in the unit region respectively receive one of the voltages of the divided voltage points, the contact pad at the center is connected to the predetermined output, the respective switch transistors in the unit region are respectively operated as the switch circuits, thereby, by selecting ON/OFF of the plurality of switch transistors in the unit region in response to the data the analog conversion voltage is obtained.

6. A D/A conversion circuit according to claim 5, wherein a plurality of the unit regions are arranged in adjacent manner in the IC.

7. A D/A conversion circuit according to claim 6, wherein the selection of turning ON/OFF of the switch transistors is performed in such a manner that all of a plurality of switch transistors between one of the contact pads at both ends and the contact pad at the center in one unit region among the plurality of unit regions arranged in adjacent manner are turned ON and all of the remaining switch transistors are turned OFF.

8. A D/A conversion circuit according to claim 7, wherein the unit region is formed as a cell including the guard ring, and the MOS transistor is an enhancement MOS transistor.

9. A D/A conversion circuit according to claim 8, wherein source forming regions, drain forming regions or forming regions of both of the plurality of switch transistors are formed in plurality with a predetermined interval between one of the contact pads at both ends and the contact pad at the center and the other of contact pads and the contact pad at the center, the gate regions of the respective transistors are formed in a narrow rectangular shape while bridging each of the source regions and the drain regions with the predetermined interval and a plurality of wiring lines are provided on respective upper layers of the gate regions of the respective transistors, the plurality of wiring lines are selectively connected either the gate regions or gate regions of transistors corresponding to the switch transistors in another of the unit regions.

10. A D/A conversion circuit according to claim 9, further comprising a buffer amplifier connected to the predetermined output, wherein an output of the buffer amplifier serves as the output of the D/A conversion circuit and the buffer amplifier is provided in the IC and the plurality of wiring lines are two, and one of the wiring lines receives a signal at a certain digit position of the data and the remaining one receives the signal at the certain digit position via an inverter.

11. A display panel drive circuit comprising D/A conversion circuits according to claim 1, each of which is provided so as to correspond to each terminal pins of a display panel, wherein the predetermined output of the D/A conversion circuits is provided for driving the display panel.

12. A display device comprising the display panel drive circuit and the display panel according to claim 11.

* * * * *